(12) United States Patent
Bui et al.

(10) Patent No.: US 6,593,636 B1
(45) Date of Patent: Jul. 15, 2003

(54) HIGH SPEED SILICON PHOTODIODES AND METHOD OF MANUFACTURE

(75) Inventors: Peter Steven Bui, Westminster, CA (US); Narayan Dass Taneja, Long Beach, CA (US)

(73) Assignee: UDT Sensors, Inc., Hawthorne, CA (US)

( * ) Notice: Subject to any disclaimer, the term of this patent is extended or adjusted under 35 U.S.C. 154(b) by 0 days.

(21) Appl. No.: 09/730,896

(22) Filed: Dec. 5, 2000

(51) Int. Cl.$^7$ .................... H01L 31/028; H01L 31/0352
(52) U.S. Cl. .................... 257/463; 257/458; 257/464; 257/466
(58) Field of Search .................... 257/458, 459, 257/460, 461, 463–466

(56) References Cited

U.S. PATENT DOCUMENTS

| | | | |
|---|---|---|---|
| 4,079,405 A | * 3/1978 | Ohuchi et al. | 257/464 |
| 4,616,247 A | * 10/1986 | Chang et al. | 257/459 |
| 4,857,980 A | * 8/1989 | Hoeberechts | 257/466 |
| 5,040,039 A | * 8/1991 | Hattori et al. | 257/463 |
| 5,252,851 A | * 10/1993 | Mita et al. | 257/461 |
| 5,315,148 A | * 5/1994 | Fujimura | 257/459 |
| 5,418,396 A | * 5/1995 | Mita | 257/461 |
| 6,027,956 A | 2/2000 | Irissou | 438/68 |

OTHER PUBLICATIONS

"Opto–Semiconductors for Optical Fiber Communication", 0/0/2000, Hamamatsu Photonics K.K., Solid State Division, Hamamatsu City, Japan.

"Standard Photodetector Catalog", 0/0/1999, UDT Sensors, Inc., Hawthorne, California.

* cited by examiner

*Primary Examiner*—Gene M. Munson
(74) *Attorney, Agent, or Firm*—Thelen Reid & Priest LLP; David B. Ritchie (57) ABSTRACT

A high-speed silicon photodiode and method of manufacture include a first layer of silicon having thickness in a range of about 125 μm to about 550 μm. A second layer of silicon has a thickness in a range of about 3 μm to about 16 μm and a resistivity of at least about 500 ohm-cm. This first layer is doped with a second type of impurity. In an alternative aspect, a high-speed silicon photodiode and method of manufacture includes a silicon wafer doped with a first type of impurity. On a first side of the wafer a doping of a second type is applied in an active area of a photodiode. On the reverse of the wafer a volume of silicon is etched away and the resulting trench is coated with a conductor. The wafer may also exhibit a high resistivity of at least about 500 ohm-cm. In each aspect, a reverse bias not exceeding about 3.3 volts permits operation with a frequency response of at least 750 MHz.

1 Claim, 9 Drawing Sheets

HIGH SPEED SILICON PHOTODIODES AND METHOD OF MANUFACTURE

FIELD OF THE INVENTION

This invention is related to the field of photodiodes. More particularly, it is related to silicon photodiodes useable in high-speed telecommunications applications.

BACKGROUND OF THE INVENTION

Silicon photodiodes are semiconductor devices responsive to high-energy particles and photons. Photodiodes operate by absorption of photons or charged particles and generate a flow of current in an external circuit, proportional to the incident power. Photodiodes can be used to detect the presence or absence of minute quantities of light. Planar diffused silicon photodiodes (also known as PIN diodes) are simply P-N junction diodes. A P-N junction can be formed by diffusing either a P-type impurity (anode), such as Boron, into a N-type bulk silicon wafer, or a N-type impurity (cathode), such as phosphorous, into a P-type bulk silicon wafer. The diffused area defines the photodiode active area—that region of the photodiode sensitive to incident radiation.

To form an ohmic contact another impurity diffusion into the backside of the silicon wafer is necessary. The impurity is an N-type for a diode with a P-type active area and the impurity is P-type for a diode with an N-type active area. The contact pads are typically deposited on the front active area in defined areas, and on the backside, completely covering the device. The active area is covered with an anti-reflection coating to reduce the reflection of the light for a specified predefined wavelength. The non-active area on the top is covered with a thick layer of silicon oxide ($SiO_2$). By controlling the thickness of the bulk substrate, the speed and response of the photo diode can be controlled. Photo diodes, when biased, must be operated in the reverse bias mode, i.e., a relatively negative voltage applied to the anode and a relatively positive voltage applied to the cathode.

Figure 1:
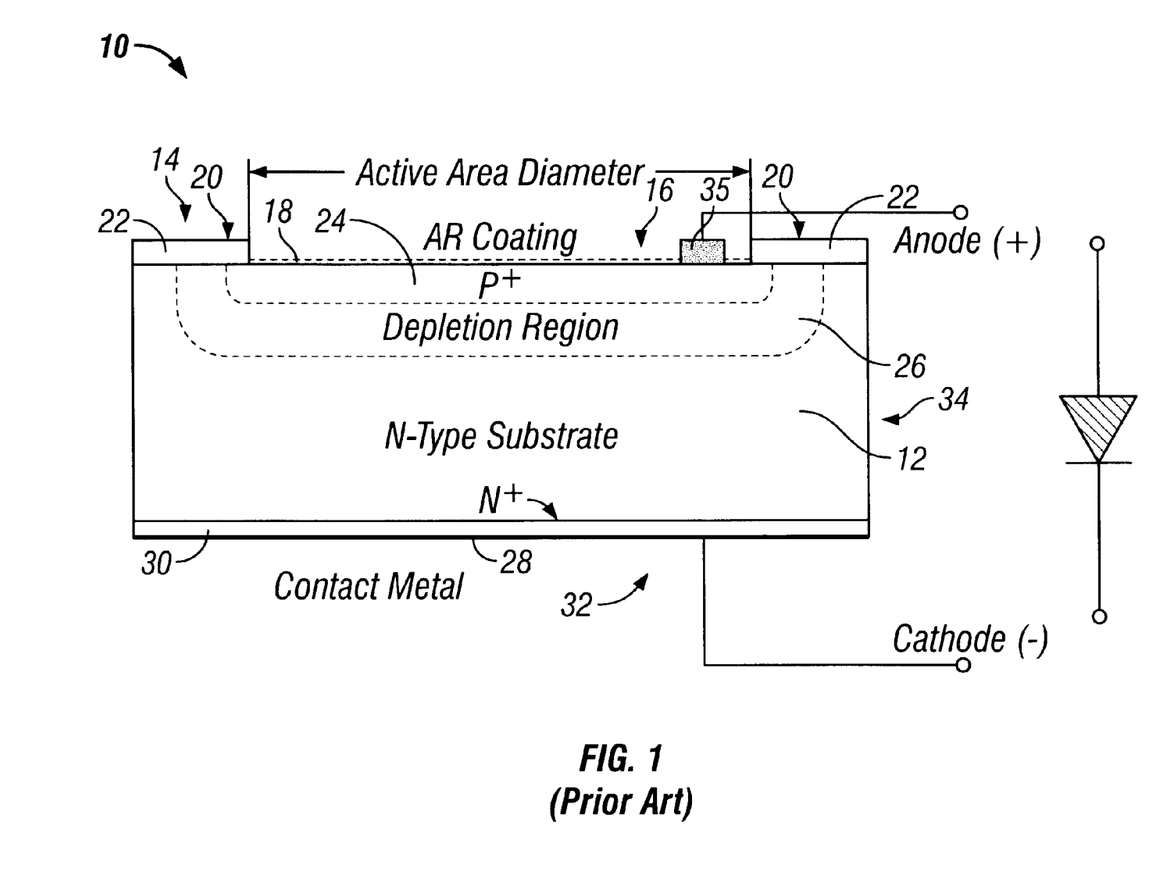
FIG. 1 is a diagram illustrating the construction of a conventional silicon photodiode on a substrate of N-type silicon.

FIG. 1 illustrates a conventional silicon photodiode 10 built on an N-type substrate 12. The front side 14 of the diode 10 includes an active photo receptor area 16 coated with an anti-reflection coating 18 and a non-active area 20 coated with a layer of $SiO_2$ 22. A P+ diffusion region 24 is formed in the substrate in the area of the active photoreceptor area. Between the P+ diffusion region 24 and the substrate 12 exists a depletion region 26. A metallization layer 28 is formed in contact with an N+ diffusion region 30 on the backside 32 of the silicon wafer 34. A first contact 35 forms an electrical contact with P+ diffusion region 24. Metal layer 28 forms a second contact.

Figure 2:
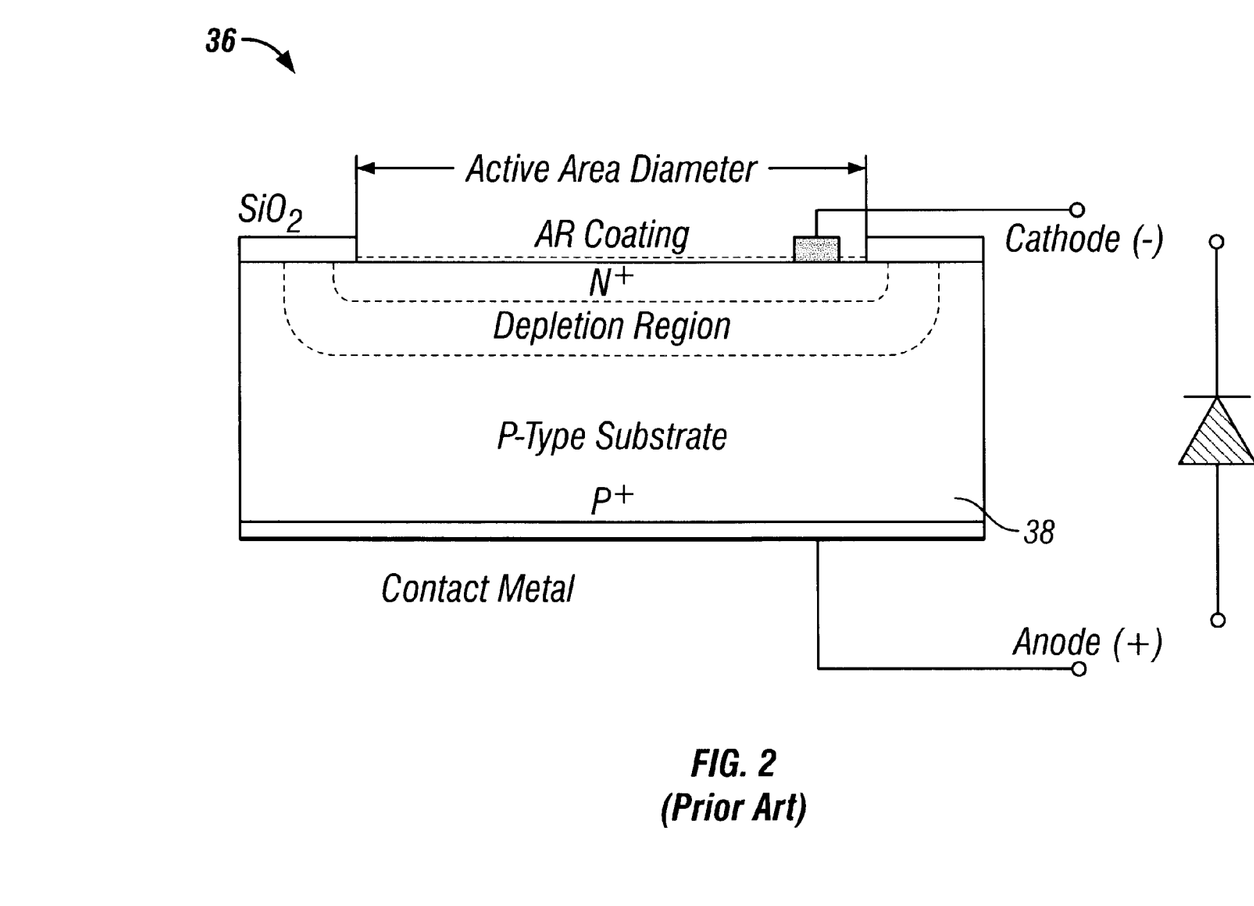
FIG. 2 is a diagram illustrating the construction of a silicon photodiode on a substrate of P-type silicon.

FIG. 2 illustrates a conventional photodiode 36 built on a P-type substrate 38. The structure is similar to that of the diode of FIG. 1 except that current flow is reversed.

Silicon is a semiconductor with a band gap energy of 1.12 eV at room temperature. This is the gap between the valence band and the conduction band. At absolute zero temperature the valence band is completely filled and the conduction band is vacant. As the temperature increases, the electrons become excited and escalate from the valence band to the conduction band by thermal energy. The electrons can also be escalated to the conduction band by particles or photons with energies greater than 1.12 eV, which corresponds to wavelengths shorter than 1100 nm. The resulting electrons in the conduction band are free to conduct current.

Figure 3:
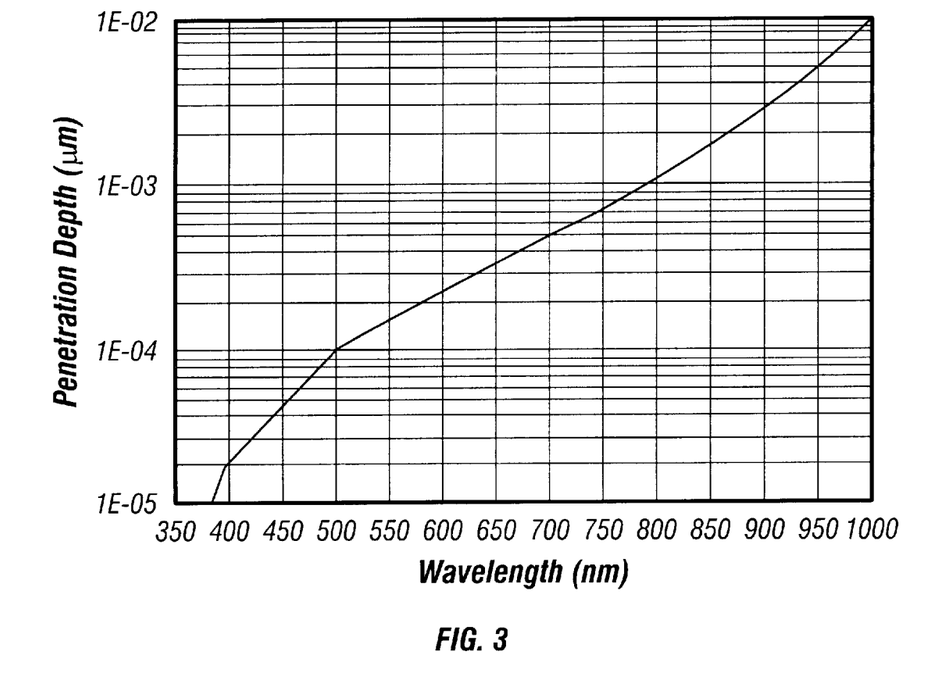
FIG. 3 is a graph illustrating penetration depth of light into a silicon substrate for various wavelengths.

Due to the concentration gradient, the diffusion of electrons from the N-type region to the P-type region and the diffusion of holes from the P-type region to the N-type region, develops a built-in voltage across the junction. The inter-diffusion of electrons and holes between the N and P regions across the junction results in a region with no free carriers. This is the depletion region. The built-in voltage across the depletion region results in an electric field with a maximum at the junction and no field outside of the depletion region. Any applied reverse bias adds to the built-in voltage and results in a wider depletion region. The electron-hole pairs generated by light are swept away by the electric field of the depleted region. The current generated is proportional to the incident light or radiation power. The light is absorbed exponentially down with distance and is proportional to the absorption coefficient. The absorption coefficient is very high for shorter wavelengths in the UV region and is small for longer wavelengths (FIG. 3). Hence, short wavelength photons such as UV, are absorbed in a thin top surface layer while silicon becomes transparent to light wavelengths longer than 1200 nm. Moreover, photons with energies smaller than the band gap are not absorbed at all.

Figure 4:
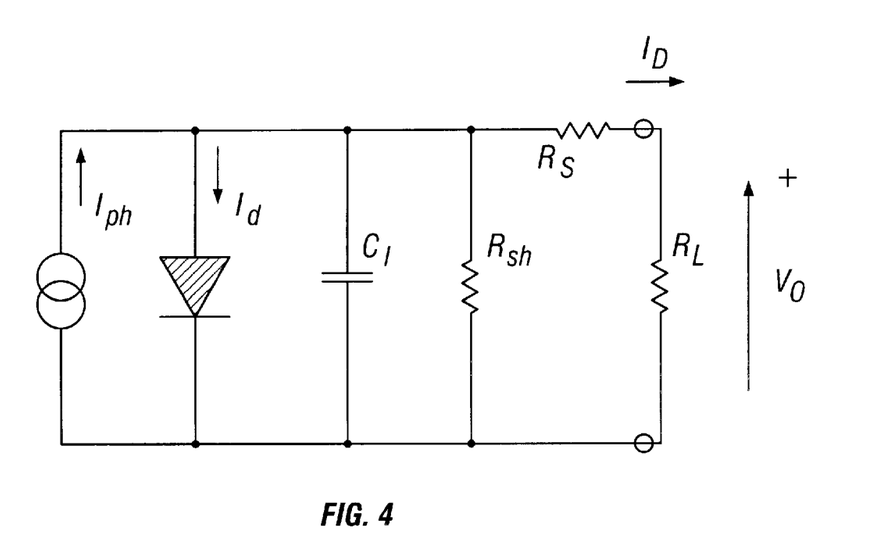
FIG. 4 is an equivalent circuit for the silicon photodiode.

A silicon photodiode can be represented by a current source in parallel with an ideal diode (FIG. 4). The current source represents the current generated by the incident radiation, and the diode represents the p-n junction. In addition, a junction capacitance ($C_j$) and a shunt resistance ($R_{SH}$) are in parallel with the other components. Series resistance ($R_S$) is connected in series with all components in this model.

Shunt Resistance, $R_{SH}$

Shunt resistance is the slope of the current-voltage curve of the photodiode at the origin, i.e. V=0. Although an ideal photodiode should have a shunt resistance of infinite, actual values range from 10 s to 1000 s of Mega ohms. Experimentally it is obtained by applying ±10 mV, measuring the current and calculating the resistance. Shunt resistance is used to determine the noise current in the photodiode with no bias (photovoltaic mode). For best photodiode performance the highest shunt resistance is desired.

Series Resistance, $R_S$

Series resistance of a photodiode arises from the resistance of the contacts and the resistance of the undepleted silicon (FIG. 1). It is given by:

$$R_s = \frac{(W_s - W_d)\rho}{A} + R_c \qquad \text{(EQ. 1)}$$

where $W_s$ is the thickness of the substrate, $W_d$ is the width of the depleted region, A is the diffused area of the junction, $\rho$ is the resistivity of the substrate and $R_c$ is the contact resistance. Series resistance is used to determine the linearity of the photodiode in photovoltaic mode (no bias, V=0). Although an ideal photodiode should have no series resistance, typical values ranging from 10 to 1000 ohms are measured.

Junction Capacitance, $C_j$

The boundaries of the depletion region act as the plates of a parallel plate capacitor (FIG. 1). The junction capacitance is directly proportional to the diffused area and inversely proportional to the width of the depletion region. In addition, higher resistivity substrates have lower junction capacitance.

Figure 5:
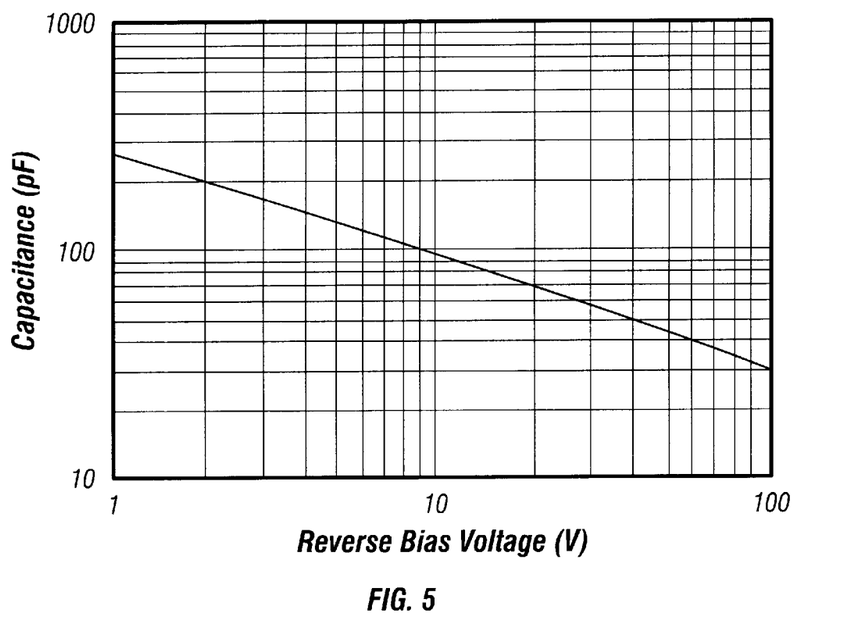
FIG. 5 is a graph of capacitance versus reverse bias voltage for a typical PIN diode.

Furthermore, the capacitance is dependent on the reverse bias as follows:

$$C_j = \frac{\varepsilon_{Si}\varepsilon_o A}{\sqrt{2\varepsilon_{Si}\varepsilon_o \mu \rho(V_A + V_{bi})}} \quad (EQ.\ 2)$$

where $\varepsilon_o = 8.854 \times 10^{14}$ F/cm, is the permitivity of free space, $\varepsilon_{Si} = 11.9$ is the silicon dielectric constant, $\mu = 1400$ cm$^2$/Vs is the mobility of the electrons at 300·K, $\rho$ is the resistivity of the silicon, $V_{bi}$ is the built-in voltage of silicon and $V_A$ is the applied bias. FIG. 5 shows the dependence of the capacitance on the applied reverse bias voltage. Junction capacitance is used to determine the speed of the response of the photodiode.

Rise/Fall Time and Frequency Response, $t/f_{3dB}$

The rise time and fall time of a photodiode is defined as the time for the signal to rise or fall from 10% to 90% or 90% to 10% of the final value respectively. This parameter can be also expressed as frequency response, which is the frequency at which the photodiode output decreases by 3 dB. It is roughly approximated by:

$$t_r = \frac{0.35}{f_{3dB}} \quad (EQ.\ 3)$$

There are three factors defining the response time of a photodiode:

1. $t_{DRIFT}$, the charge collection time of the carriers in the depleted region of the photodiode.
2. $t_{DIFFUSED}$, the charge collection time of the carriers in the undepleted region of the photodiode.
3. $t_{RC}$, the RC time constant of the diode-circuit combination.

$t_{RC}$ is determined by $t_{RC} = 2.2$ RC, where R is the sum of the diode series resistance and the load resistance ($R_s + R_l$), and C is the sum of the photodiode junction and the stray capacitances ($C_j + C_s$). Since the junction capacitance ($C_j$) is dependent on the diffused area of the photodiode and the applied reverse bias (Equation 2), faster rise times are obtained with smaller diffused area photodiodes, and larger applied reverse biases. In addition, stray capacitance can be minimized by using short leads, and careful layout of the electronic components. The total rise time is determined by:

$$t_R = \sqrt{t_{DRIFT}^2 + t_{DIFFUSED}^2 + t_{RC}^2} \quad (EQ.\ 4)$$

Generally, in photovoltaic mode of operation (no bias), rise time is dominated by the diffusion time for diffused areas less than 5 mm$^2$ and by RC time constant for larger diffused areas for all wavelengths. When operated in photoconductive mode (applied reverse bias), if the photodiode is fully depleted, such as fiber optic series, the dominant factor is the drift time. In non-fully depleted photodiodes, however, all three factors contribute to the response time.

Most high-speed photodiodes are now made with Indium Galium Arsenide (InGaAs) substrates due to the need for high performance in the 1.2–1.6 μm wavelength range where attenuation is lowest in silicon-based fiber optic cables. Silicon photodiodes exhibit useable sensitivities in the 0.750–0.900 μm range and, as a result, have not yet found significant application in long-haul telecommunications systems.

Figure 6:
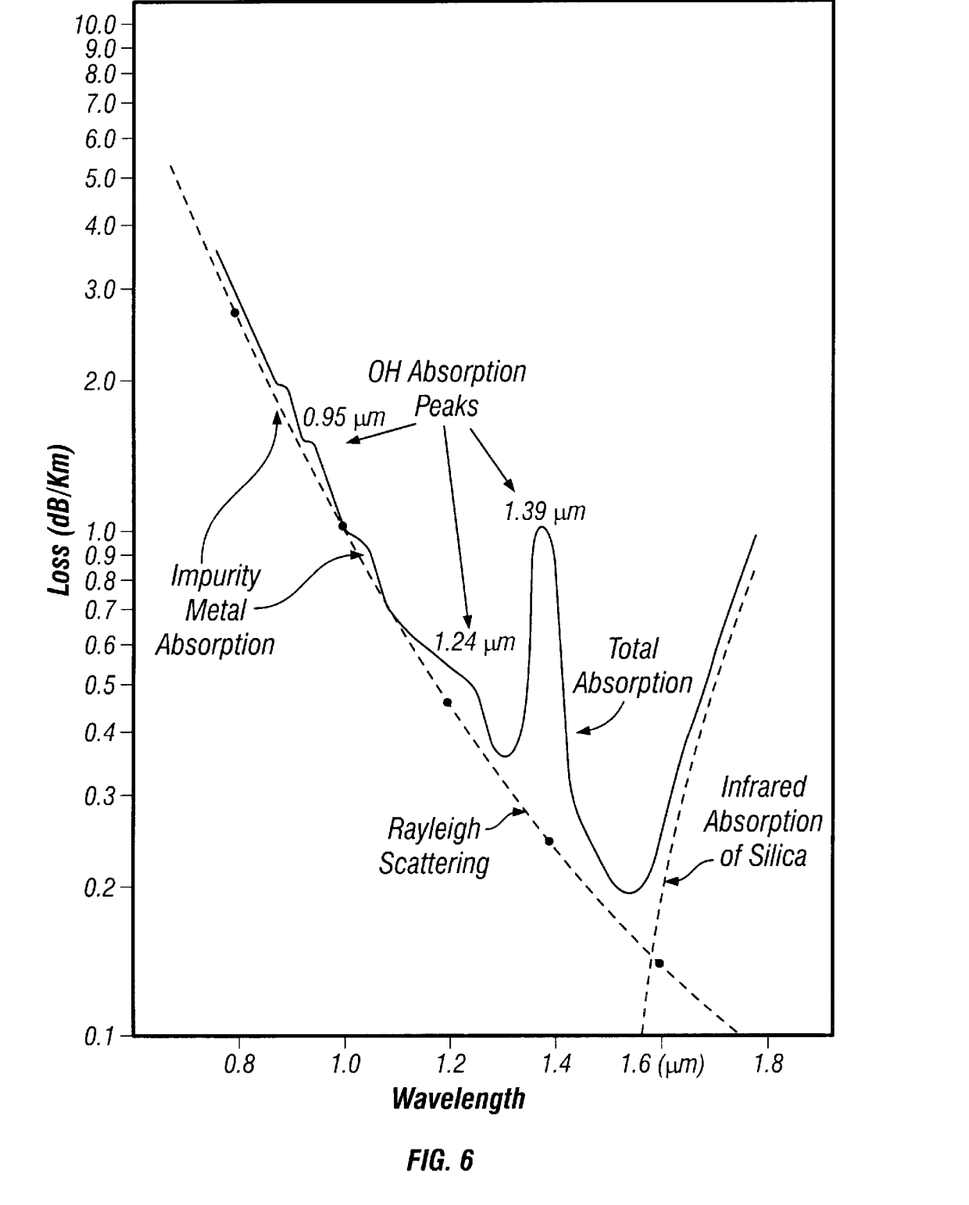
FIG. 6 is a graph of total attenuation of light in silicon fiber as a function of wavelength.

FIG. 6 illustrates the attenuation of light as a function of wavelength in silicon fiber optic material. Total attenuation shown is the sum of absorption and scattering losses. At 0.8 μm, attenuation is about 2–3 dB/km and scattering losses. While at 1.3 μm, attenuation is only about 0.35 dB/km.

Recently, however, as fiber optic telecommunications systems have found application in relatively short-haul communications systems, the lower cost of silicon photodiode makes them attractive in so-called campus and metropolitan area networking where transmission distances are less than a few km.

While the attenuation problems due to operation in the 750 nm–900 nm range is, therefore, capable of being overcome, today's telecommunication systems need to be able to operate at high speeds in excess of 1 GB/sec with low voltage bias. Accordingly, a high-speed (>1 GB/sec) silicon photodiode operable at a bias of about 3.3 volts or less would be desirable.

In accordance with the present invention, novel techniques are used to reduce the response time of a silicon photodiode by reducing the drift time of electron-hole pairs within the bulk of the wafer on which the silicon photodiode is fabricated.

SUMMARY OF THE INVENTION

A high-speed silicon photodiode and method of manufacture include a first layer of silicon having thickness in a range of about 125 μm to about 550 μm. A second layer of silicon has a thickness in a range of about 3 μm to about 16 μm and a resistivity of at least about 500 ohm-cm. This first layer is doped with a second type of impurity. In an alternative aspect, a high-speed silicon photodiode and method of manufacture includes a silicon wafer doped with a first type of impurity. On a first side of the wafer a doping of a second type is applied in an active area of a photodiode. On the reverse of the wafer a volume of silicon is etched away and the resulting trench is coated with a conductor. The wafer may also exhibit a high resistivity of at least about 500 ohm-cm. In each aspect, a reverse bias not exceeding about 3.3 volts permits operation with a frequency response of at least 750 MHz.

BRIEF DESCRIPTION OF THE FIGURES

The accompanying drawings, which are incorporated into and constitute a part of this specification illustrate one or more embodiments of the invention and, together with the present description, serve to explain the principles and implementation of the invention.

In the drawings.

DETAILED DESCRIPTION

Embodiments of the present invention are described herein in the context of a high-speed silicon photodiode and method of manufacture. Those of ordinary skill in the art will realize that the following description of the present invention is illustrative only and not intended to be in any way limiting. Other embodiments of the invention will readily suggest themselves to such skilled persons having the benefit of this disclosure. Reference will now be made in detail to implementations of the present invention as illustrated in the accompanying drawings. The same reference numbers will be used throughout the drawings and the following description to refer to the same or like parts.

In the interest of clarity, not all of the routine features of the implementations described herein are described. It will of course be appreciated that in the development of any such actual implementation, numerous implementation-specific decisions must be made to achieve the developer's specific goals, such as compliance with system-and business-related goals, and that these goals will vary from one implementation to another. Moreover, it will be appreciated that such a development effort might be complex and time-consuming, but would nevertheless be a routine undertaking of engineering for those of ordinary skill in the art having the benefit of this disclosure.

In accordance with the present invention, novel techniques are used to reduce the response time of a silicon photodiode by reducing the drift time of electron-hole pairs within the bulk of the wafer on which the silicon photodiode is fabricated.

Figure 7:
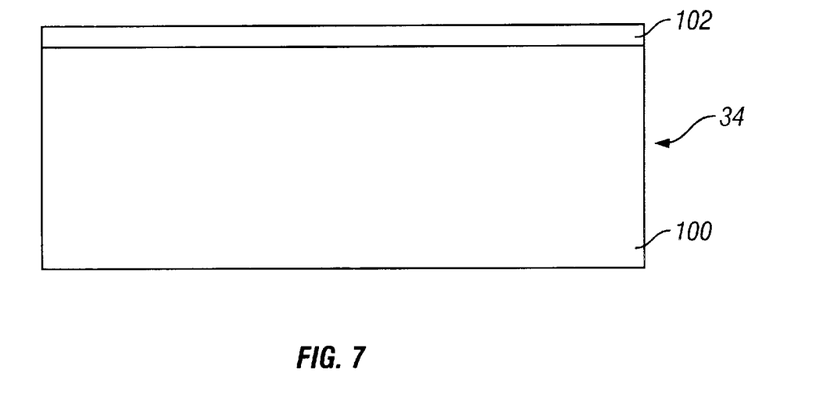
FIG. 7 is an elevational diagram of an epitaxial-type wafer as used in accordance with a specific embodiment of the present invention.

In accordance with a first specific embodiment of the present invention, the silicon wafer used is a silicon epitaxial type wafer. Turning to FIG. 7, the silicon epitaxial wafer 34 includes a single crystal 1-1-1 or 1-0-0 oriented silicon substrate 100, preferably N-doped with arsenic (As) to an impurity concentration of about $10^{19}/cm^3$. The substrate 100 preferably has a thickness in a range of about 125 µm to about 550 µm with about 400–525 µm being presently preferred. The resistivity of the substrate is preferably in a range of about 0.002–0.0045 ohm-cm. Epitaxial layer 102 is formed on substrate 100 as shown in FIG. 7. Epitaxial layer 102 preferably has a thickness in a range of about 3 µm to about 16 µm with 12–16 µm being presently preferred. The resistivity of layer 102 is preferably high and at least about 500 ohm-cm with about 500 to about 1000 ohm-cm being presently preferred. This is desired because if the resistivity is too low, the epitaxial layer will not be depleted at low reverse bias while epitaxial resistivity of more than 1000 ohm-cm is currently beyond the capability of epitaxial reactors to grow. Layer 102 is preferably N-doped and has a 1-1-1 or 1-0-0 crystalline orientation. Such wafers are available commercially from conventional silicon wafer supply houses.

Figure 8:
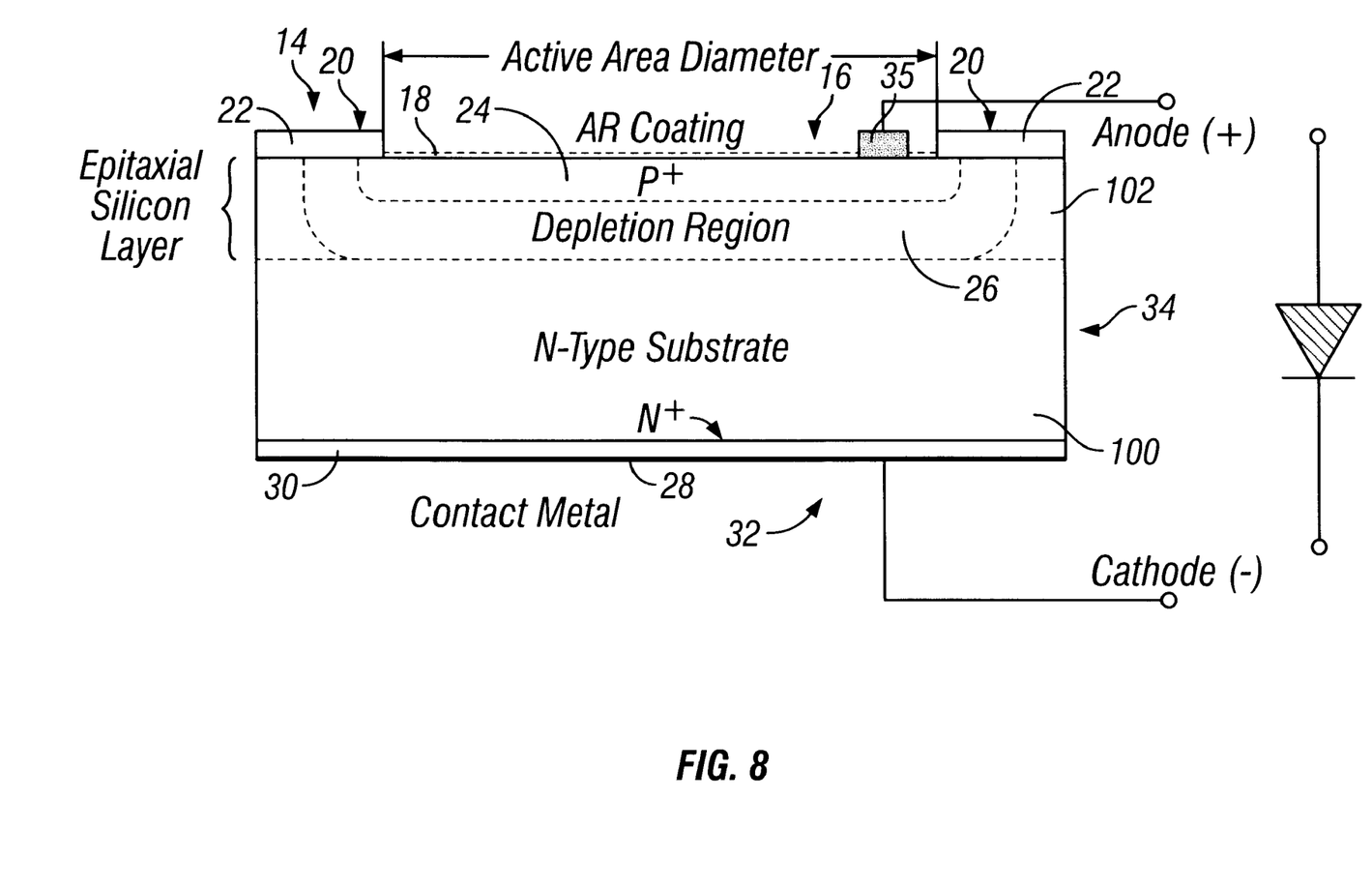
FIG. 8 is an elevational cross-sectional diagram of an epitaxial-type silicon photodiode having an N-type substrate in accordance with a specific embodiment of the present invention.

FIG. 8 illustrates an epitaxial-type silicon photodiode in more detail. The rest of the features of this diode are similar to the diode illustrated in FIG. 1 and discussed in detail above. N+ diffusion 30 is preferably about 1 µm thick, P+ diffusion 24 is preferably about 0.4 µm thick and doped with boron (B) to an impurity concentration of about $2\times10^{19}/cm^3$. The anti-reflection (AR) coating layer 18 is preferably a conventional silicon nitride/silicon dioxide layer. The contact metal layer 28 is preferably about 200 angstroms of Chromium (Cr) (or antimony (Sb)) in contact with N+ diffusion layer 30 and 600 angstroms of gold (Au) in contact with the Cr (or Sb) layer.

Where a P-type substrate is used, the P+ and N+ diffusions are exchanged, the P+ diffusion is preferably about 1 µm in thickness, the N+ diffusion is preferably about 0.4 µm in thickness and the substrate is preferably P-doped to an impurity concentration of about $2\times10^{18}/cm^3$. The epitaxial layer is P-type 1-1-1 epitaxial silicon having a resistivity of at least 500 ohm-cm. The remaining details remain substantially the same.

In the silicon photodiode of FIG. 8 the very thin epitaxial layer serves to receive the photons coming into the active area. The thin and high resistivity epitaxial layer makes the device fully depleted even at low (3.3 volt) reverse bias voltage. In this way the response time of the device is reduced so that operation at 750 MHz or more is now possible.

Figure 9:
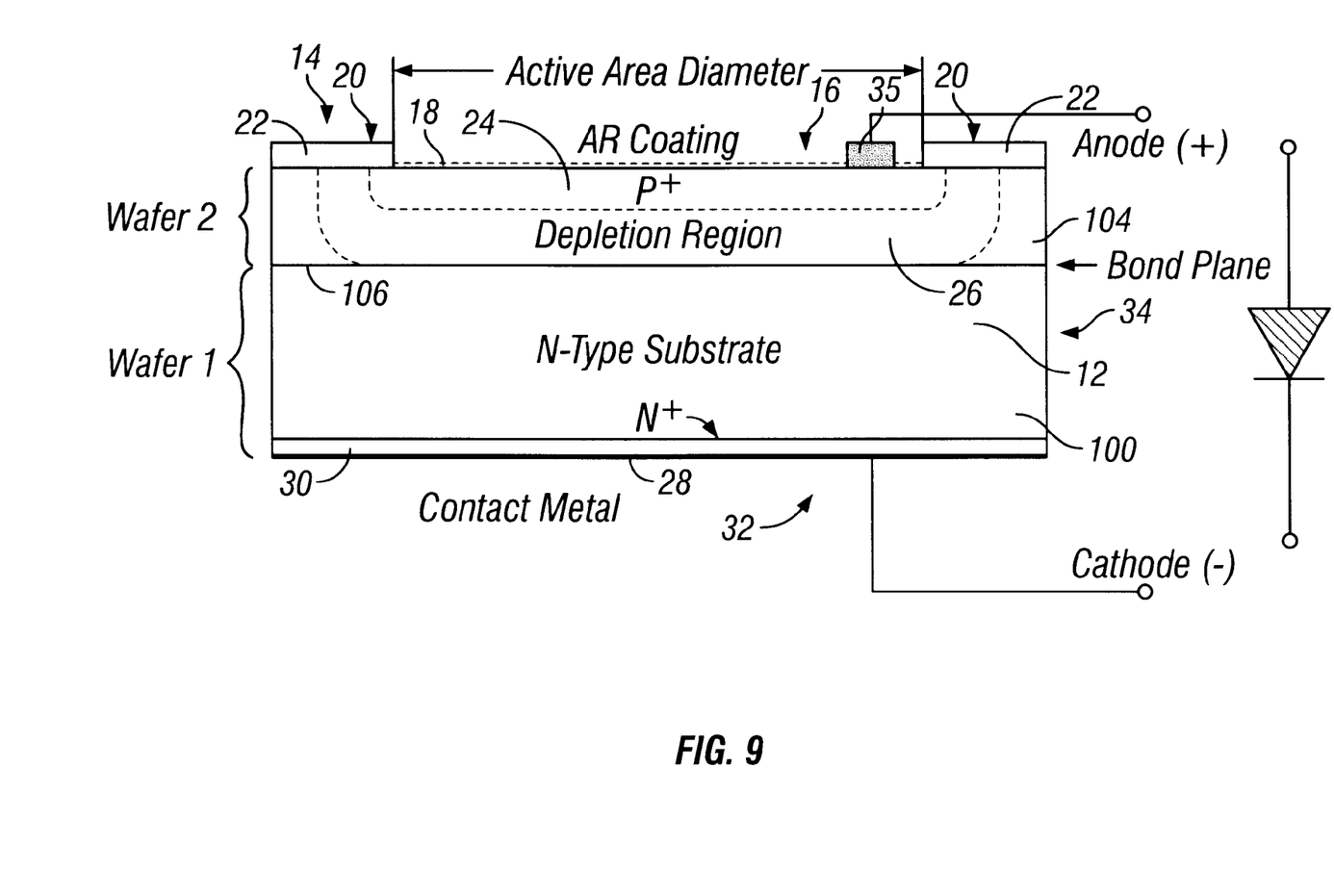
FIG. 9 is an elevational cross-sectional diagram of a sandwich-type silicon photodiode having an N-type substrate in accordance with a specific embodiment of the present invention.

In accordance with another specific embodiment of the present invention as illustrated in FIG. 9, the substrate is formed of two wafers bonded together at a bond plane. The details of this embodiment are similar to that of the FIG. 8 embodiment except as follows. The substrate wafer 100 is the same but the second wafer 104 bonded to wafer 100 along a bond plane 106 is similar in characteristic to epitaxial layer 102 of FIG. 8 except that it is not epitaxial. For example, in the N-type substrate embodiment it may be N-type single crystal silicon preferably with a high resistivity. As in the FIG. 8 embodiment, the thin and high resistivity device bonded layer makes the device fully depleted even at low (3.3 volt) reverse bias voltage. Thus, the response time of the photodiode is reduced significantly.

Figure 10:
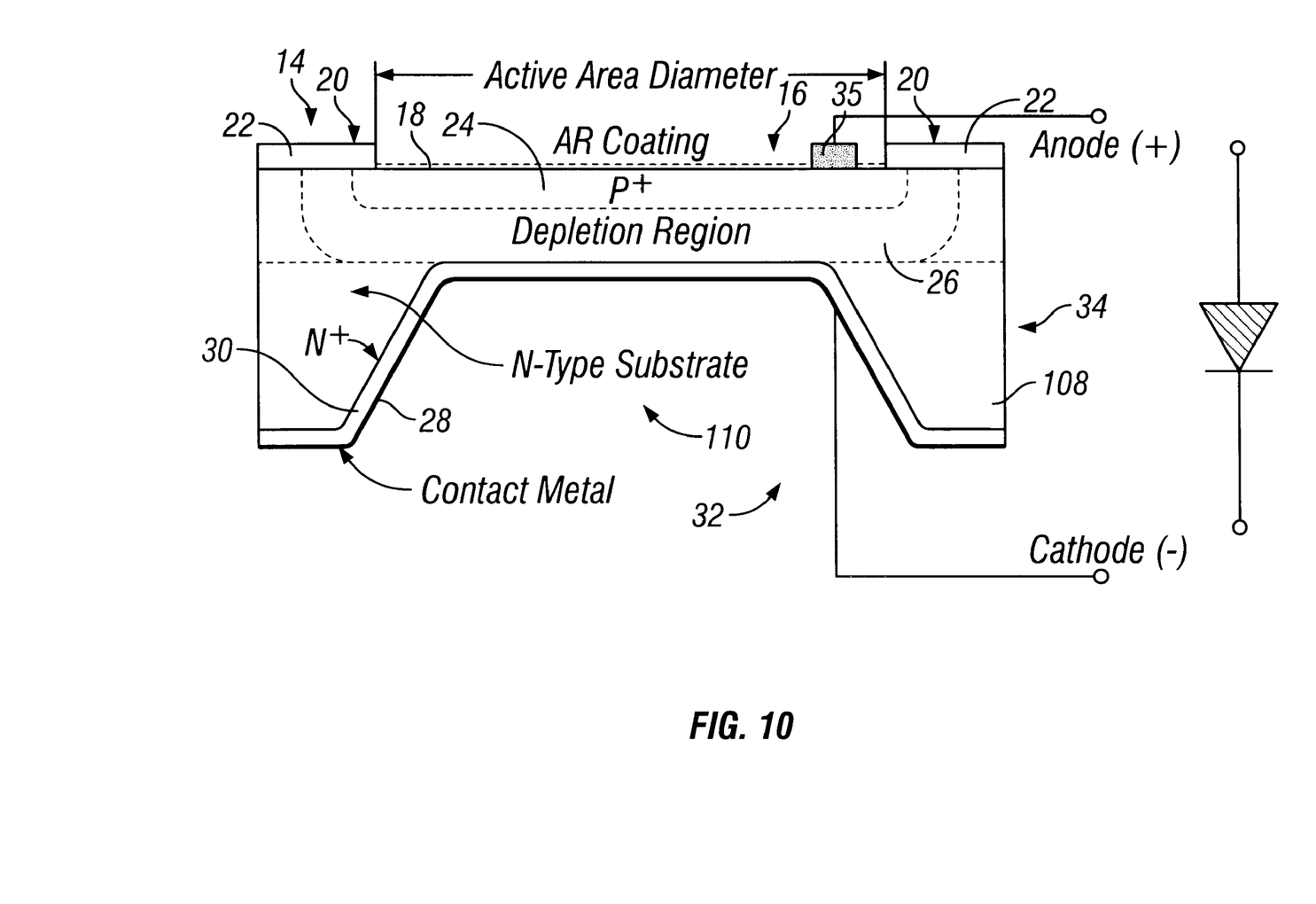
FIG. 10 is an elevational cross-sectional diagram of a backside trench-type silicon photodiode having an N-type substrate in accordance with a specific embodiment of the present invention.

In accordance with another specific embodiment of the present invention, as illustrated in FIG. 10, the backside substrate is etched away to reduce the effective thickness of the substrate in the region of the active area of the photodiode very thin, e.g., in a range of about 3 µm to about 16 µm . As shown in FIG. 10, the photodiode is constructed much the same as in the previous embodiments, but the backside is etched to form a trench 110 as shown. Metalization is applied to the trench walls as before. Because the distance from the AR coating 18 to the metalization layer 28 in the active region is on the order of 3–16 µm instead of more than 100 µm, light at 850 µm wavelength will penetrate through the active region and is reflected at the metalization layer 28. This structure gives two advantages: reduced response time and improved quantum efficiency since the effective absorption length is now approximately twice the active region thickness.

Figure 11:
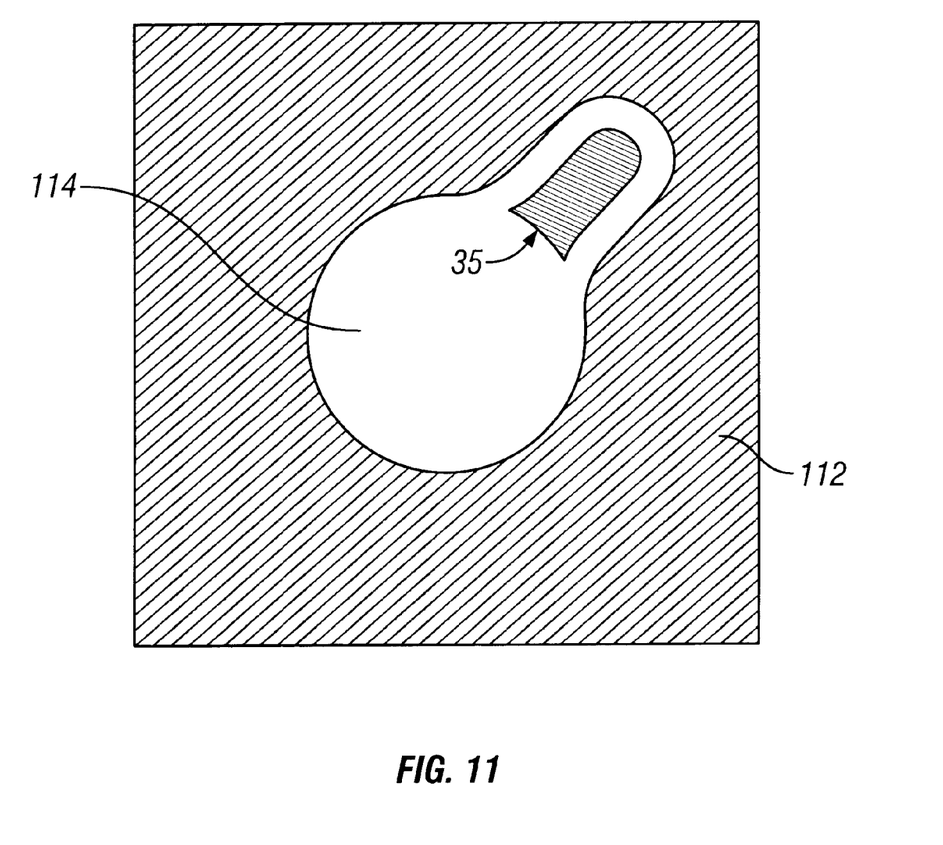
FIG. 11 is a top plan view of a silicon photodiode in accordance with a specific embodiment of the present invention.

Turning now to FIG. 11, the topside of a silicon photodiode formed in accordance with the principles of the present invention is illustrated. A mask (silicon oxide or another suitable material) 112 blocks light from entering non-active areas of the photodiode. The active area 114 is clear of the mask. A topside contact 35 is provided which does not block the active area.

A diode in accordance with FIG. 10 may be fabricated as follows:

First, the starting material may be an N-type phosphorous-doped 1-0-0 orientation 150 µm thick silicon wafer with a resistivity of 500–1000 ohm-cm.

Second, a mask oxidation step is performed on the front side.

Third, an N+ stop ring is masked and etched about the diode active area.

Fourth, a phosphorous diffusion forms the N+ stop ring about the active area.

Fifth, the active area is masked and etched to a diameter preferably in a range of about 150 µm to about 400 µm.

Sixth, a boron diffusion forms the P+ diffusion under the active area.

Seventh, the AR coating is deposited.

Eighth, the contact 35 window is masked and etched.

Ninth, the aluminum metalization is applied.

Tenth, a temporary PECVD nitride layer 1 µm thick is applied to protect the front side during the backside processing which follows.

Eleventh, the groove or trench is etched on the backside using the nitride as an etching mask.

Twelfth, the protective nitrate is removed from the front side.

Finally, the metalization is applied to the backside in a conventional chromium/gold, antimony/gold or Aluminum/Nickel/Gold process.

The process used to form the diode of FIG. 8 and FIG. 9 varies slightly as discussed above based upon the starting material.

While embodiments and applications of this invention have been shown and described, it would be apparent to those skilled in the art having the benefit of this application that many more modifications than mentioned above are possible without departing from the inventive concepts herein. The invention, therefore, is not to be restricted except in the spirit of the appended claims.

What is claimed is:

1. A photodiode, comprising:

a first layer comprised of silicon doped with a first type of impurity, said first layer having a resistivity of less than about 0.03 ohm-cm and a thickness in a range of about 125 µm to about 550 µm;

a second layer formed on the first layer comprised of silicon having a resistivity of at least 500 ohm-cm, said second layer having a thickness in a range of about 3 µm to about 16 µm;

a region formed in said second layer doped with a second type of impurity, said photodiode characterized in that with a reverse bias not exceeding 3.3 volts it exhibits a minimum frequency response of 750 MHz;

a mask layer disposed over and in contact with said second layer, said mask layer having a first aperture therethrough disposed over at least a portion of said region;

a second aperture etched substantially through said first layer from a side of said photodiode opposite said region; and a third layer of an electrically conductive material disposed in said second aperture.

* * * * *

UNITED STATES PATENT AND TRADEMARK OFFICE
CERTIFICATE OF CORRECTION

PATENT NO. : 6,593,636 B1
DATED : July 15, 2003
INVENTOR(S) : Peter Steven Bui and Narayan Dass Taneja It is certified that error appears in the above-identified patent and that said Letters Patent is hereby corrected as shown below:

<u>Title page, Item [54] and Column 1, lines 1-2,</u>
Replace "HIGH SPEED SILICON PHOTODIODES AND METHOD OF MANUFACTURE" with -- HIGH SPEED SILICON PHOTODIODE --.

<u>Column 3,</u>
Line 15, replace "$t / t / f_{3dB}$" with -- $t_r / t_f / f_{3dB}$ --.

Signed and Sealed this

Twenty-third Day of December, 2003

JAMES E. ROGAN
*Director of the United States Patent and Trademark Office*